US009287103B2

(12) United States Patent
Baba

(10) Patent No.: US 9,287,103 B2
(45) Date of Patent: Mar. 15, 2016

(54) ION GUIDE FOR MASS SPECTROMETRY

(71) Applicant: DH Technologies Development Pte. Ltd., Singapore (SG)

(72) Inventor: Takashi Baba, Richmond Hill (CA)

(73) Assignee: DH Technologies Development Pte. Ltd., Singapore (SG)

( * ) Notice: Subject to any disclaimer, the term of this patent is extended or adjusted under 35 U.S.C. 154(b) by 0 days.

(21) Appl. No.: 14/431,606

(22) PCT Filed: Oct. 11, 2013

(86) PCT No.: PCT/IB2013/002293

§ 371 (c)(1),
(2) Date: Mar. 26, 2015

(87) PCT Pub. No.: WO2014/057345

PCT Pub. Date: Apr. 17, 2014

(65) Prior Publication Data

US 2015/0279647 A1 Oct. 1, 2015

Related U.S. Application Data

(60) Provisional application No. 61/713,205, filed on Oct. 12, 2012.

(51) Int. Cl.
*H01J 49/04* (2006.01)
*G01N 23/20* (2006.01)
(Continued)

(52) U.S. Cl.
CPC ........... *H01J 49/062* (2013.01); *H01J 49/0031* (2013.01); *H01J 49/067* (2013.01); *H01J 49/22* (2013.01)

(58) Field of Classification Search
CPC ..... G01N 27/622; G01N 27/624; H01J 49/04; H01J 49/004; H01J 49/0422; H01J 49/0481; H01J 49/062; H01J 49/066
USPC ................. 250/281, 282, 283, 286, 287, 288, 250/396 R, 423 R
See application file for complete search history.

(56) References Cited

U.S. PATENT DOCUMENTS 7,733,003 B2 * 6/2010 Hiroki ..................... H01J 1/316 313/495
7,838,826 B1 * 11/2010 Park ..................... G01N 27/622 250/281

(Continued)

FOREIGN PATENT DOCUMENTS

JP 10-208682 8/1998
JP 2002-110080 4/2002

(Continued)

OTHER PUBLICATIONS

International Search Report from International Patent Application No. PCT/IB2013/002293, dated Mar. 27, 2014.

*Primary Examiner* — David A Vanore

(57) ABSTRACT

An ion guide is provided having an enclosure extending longitudinally around a central axis from a proximal inlet end to a distal outlet end. The proximal inlet end receives a plurality of ions entrained in a gas flow through an inlet orifice. A deflection plate is disposed within the enclosure between the proximal and distal ends and deflects at least a portion of the gas flow away from a central direction of the gas flow. A plurality of electrically conductive, elongate elements extend from the proximal end to the distal end within the enclosure and generate an electric field via a combination of RF and DC electric potentials. The electric field deflects the entrained ions away from the central direction of the gas flow proximal to the deflection plate and confines the deflected ions in proximity of the elongated elements as the ions travel downstream.

20 Claims, 11 Drawing Sheets

(51) Int. Cl.

| | |
|---|---|
| ***H01J 37/244*** | (2006.01) |
| ***H01J 49/06*** | (2006.01) |
| ***H01J 49/00*** | (2006.01) |
| ***H01J 49/22*** | (2006.01) |

(56) References Cited

U.S. PATENT DOCUMENTS

| | | | | |
|---|---|---|---|---|
| 2003/0136905 | A1* | 7/2003 | Franzen | H01J 49/062 250/292 |
| 2009/0014641 | A1* | 1/2009 | Bateman | G01N 27/622 250/282 |
| 2011/0042561 | A1* | 2/2011 | Miller | H01J 49/04 250/282 |
| 2012/0228492 | A1* | 9/2012 | Franzen | H01J 49/401 250/288 |
| 2013/0153762 | A1* | 6/2013 | Munchmeyer | G01N 27/64 250/282 |
| 2013/0213150 | A1* | 8/2013 | Covey | H01J 49/0422 73/863.41 |
| 2013/0285552 | A1* | 10/2013 | Duerr | H01J 27/026 315/111.91 |
| 2015/0279647 | A1* | 10/2015 | Baba | H01J 49/062 250/282 |

FOREIGN PATENT DOCUMENTS

| | | |
|---|---|---|
| JP | 2002-175771 | 6/2002 |
| WO | 03-065404 | 8/2003 |

* cited by examiner

RF: $150V_{0\text{-}p}$, 5 MHz
cylinder: 5V, deflector: 2V, stopping plate: cylinder x 0.54
m/z: 100-1000, pressure: 5 Torr (12 MHz)

ION GUIDE FOR MASS SPECTROMETRY

This application claims priority to U.S. provisional application No. 61/713,205 filed Oct. 12, 2012, which is incorporated herein by reference in its entirety.

FIELD

The teachings herein relate to methods and apparatus for mass spectrometry, and more particularly to ion guides and methods for transporting ions.

INTRODUCTION

Mass spectrometry (MS) is an analytical technique for determining the elemental composition of test substances with both quantitative and qualitative applications. For example, MS can be useful for identifying unknown compounds, determining the isotopic composition of elements in a molecule, and determining the structure of a particular compound by observing its fragmentation, as well as for quantifying the amount of a particular compound in the sample.

In mass spectrometry, sample molecules are generally converted into ions using an ion source and then separated and detected by one or more downstream mass analyzers. For most atmospheric pressure ion sources, ions pass through an inlet orifice prior to entering an ion guide disposed in a vacuum chamber. A radio frequency (RF) voltage applied to the ion guide can provide radial focusing as the ions are transported into a subsequent, lower-pressure vacuum chamber in which the mass analyzer(s) are disposed. Though increasing the size of the inlet orifice between the ion source and ion guide can increase the number of ions entering the ion guide (which can offset ion losses and potentially increase the sensitivity of downstream detection), higher pressures in the first stage vacuum chamber from the increased gas flow can reduce the ability of the ion guide to focus the ions as a result of increased collisions with ambient gas molecules.

Accordingly, there remains a need for mass spectrometer systems and methods for maximizing the number of ions entering the ion guide while maintaining the ion transfer efficiency to downstream analyzers to attain high sensitivity.

SUMMARY

In accordance with one aspect, certain embodiments of the applicant's teaching relate to an ion guide comprising an enclosure extending longitudinally around a central axis from a proximal inlet end to a distal outlet end, the proximal inlet end being configured to receive a plurality of ions entrained in a gas flow flowing through an inlet orifice. The ion guide can also comprise a deflection plate disposed within said enclosure between the proximal and distal ends, said plate deflecting at least a portion of the gas flow away from a central direction of the gas flow. A plurality of electrically conductive, elongate elements can extend from the proximal end to the distal end within said enclosure and generate an electric field via a combination of RF and DC electric potentials applied to at least one of the enclosure and the elongate elements. The electric field deflects the entrained ions away from the central direction of the gas flow proximal to the deflection plate and confines the deflected ions in proximity of the elongated elements as said ions travel downstream.

In various embodiments, the electric field can be further configured to focus the deflected ions into an ion beam between the deflection plate and the distal end of the enclosure.

In a related aspect, the ion guide can also comprise an exit aperture through which the ion beam exits the ion guide. In various embodiments, the inlet orifice, exit aperture, and deflection plate are disposed on the central axis.

In accordance with various aspects, the enclosure can comprise an electrically conductive cylinder electrode. In some embodiments, the electrically conductive elements comprise wires. Various numbers of wires can be used. For example, the wires can comprise four wires extending from the proximal end to the distal end. Alternatively, for example, two wires can extend from the proximal end to the distal end. In some embodiments, the wires can be evenly spaced about the central axis. In various aspects, the wires can be angled such that a minimum distance between the proximal end of the wire and the central axis is smaller than a minimum distance between the distal end of the wire and the central axis. In accordance with some aspects of various embodiments, the elongate elements are offset relative to the central axis such that they are outside the gas flow at the proximal end.

In various embodiments, the enclosure defines an exit window extending through a sidewall thereof. In some aspects, for example, the deflection plate is configured to deflect the gas flow towards the exit window. In various embodiments, the deflection plate is non-orthogonally angled relative to the central axis.

In some aspects, the deflection plate can comprise a plurality of bores. In a related aspect, the elongate elements can extend through the bores.

Alternatively, in some aspects, the elongate elements extend around the deflection plate.

In various embodiments, the enclosure can be housed within a vacuum chamber. The vacuum chamber can be maintained at a sub-atmospheric pressure. By way of non-limiting example, the enclosure can be maintained at a vacuum pressure in a range of about 0.1 to about 20 Torr.

In accordance with one aspect, certain embodiments of the applicants' teachings relate to a method for transmitting ions. According to the method, a plurality of ions entrained in a gas flow is received at an inlet end of an enclosure, the enclosure extending longitudinally around a central axis from a proximal inlet end to a distal outlet end. The method can further comprise applying RF and DC electric potentials to at least one of the enclosure and a plurality of electrically conductive, elongate elements within said enclosure and extending from said proximal end to said distal end, said electric field deflecting at least a portion of said entrained ions away from the central axis and confining said deflected ions in proximity of at least one said elongated elements as ions travel toward said distal outlet end. At least a portion of the gas flow can be deflected to an opening for exiting the enclosure subsequent to deflecting said ions.

In some aspects, the method can further comprise confining said deflected ions in proximity of said elongated elements as said ions travel downstream. In various embodiments, the method can comprises focusing at least a portion of the deflected ions travelling beyond said deflection plate toward said central axis in a region distal to said deflection plate.

In accordance with one aspect, certain embodiments of the applicant's teaching relate to an ion guide comprising a proximal, inlet plate having an inlet aperture configured to receive a plurality of ions entrained in a gas flow and a distal, outlet plate having an outlet aperture configured to transmit a plurality of ions to a mass analyzer. The ion guide can also comprise a plurality of electrically conductive elements surrounding a central axis and extending within a region between the inlet and outlet plates. A deflection plate disposed between said inlet and outlet plates can be configured to deflect at least a portion of the gas flow away from a central direction of the gas flow. Further, the electrically conductive elements can be configured to separate the entrained ions from said gas flow proximal to said deflection plate and focus said separated ions along the central axis distal to said deflection plate.

In some aspects, the electrically conductive elements comprise four wires coupled to the inlet plate and extending distally therefrom. In various embodiments, the ion guide can further comprise four rods extending proximally from the outlet plate, wherein the distal end of each of the four wires is coupled to a corresponding proximal end of one of said rods.

In various aspects, the deflection plate can comprise four bores extending therethrough and offset from the central axis, each of the wires extending through one of the bores. In some embodiments, for example, each of the bores can be coaxial with a bore of a cylinder electrode extending proximally from the deflection plate.

In some aspects, the electrically conductive elements are non-parallel. In various aspects, the electrically conductive elements comprise four wires contained within an electrically conductive cylinder electrode.

In accordance with one aspect, certain embodiments of the applicant's teaching relate to an ion guide comprising an inlet for receiving a plurality of ions entrained in a gas flow. The ion guide can also comprise a plurality of electrically conductive electrodes positioned relative to one another and configured to be electrically biased so as to generate an electric field effective to remove at least a portion of said ions entering the waveguide from the gas flow such that said removed ions travel in proximity of one of more of said electrodes downstream from said inlet. For example, in some aspects, the electric field can generate a potential well in vicinity of at least one of said electrodes for receiving at least some of said removed ions.

In some aspects, the electric field comprises a DC component and an RF component. In various embodiments, the inlet is configured to receive the ion-containing gas flow along a central axis of the guide and wherein said electrodes are positioned offset from said central axis.

In various embodiments, the ion guide can further comprise a gas deflection element positioned downstream from said inlet so as to deflect the gas flow subsequent to said removal of at least a portion of the ions from the gas flow.

These and other features of the applicant's teachings are set forth herein.

BRIEF DESCRIPTION OF THE DRAWINGS

The skilled person in the art will understand that the drawings, described below, are for illustration purposes only. The drawings are not intended to limit the scope of the applicant's teachings in any way.

FIGS. 5A-4D, in schematic diagram, depicts another exemplary ion guide in accordance with one aspect of various embodiments of the applicant's teachings.

DETAILED DESCRIPTION

It will be appreciated that for clarity, the following discussion will explicate various aspects of embodiments of the applicant's teachings, while omitting certain specific details wherever convenient or appropriate to do so. For example, discussion of like or analogous features in alternative embodiments may be somewhat abbreviated. Well-known ideas or concepts may also for brevity not be discussed in any great detail. The skilled person will recognize that some embodiments of the applicant's teachings may not require certain of the specifically described details in every implementation, which are set forth herein only to provide a thorough understanding of the embodiments. Similarly it will be apparent that the described embodiments may be susceptible to alteration or variation according to common general knowledge without departing from the scope of the disclosure. The following detailed description of embodiments is not to be regarded as limiting the scope of the applicant's teachings in any manner.

Methods and systems for transmitting ions in an ion guide are provided herein. In accordance with various aspects of the applicant's teachings, the methods and systems can cause at least a portion of ions entrained in a gas flow entering an ion guide to be extracted from the gas jet and be guided downstream along one or more paths separate from the path of gas flow (the gas lacking the ions can be removed from the ion guide). In some embodiments, the ions extracted from the gas stream can be guided into a focusing region in which the ions can be focused, e.g., via RF focusing, into entry into subsequent processing stages, such as a mass analyzer.

Figure 1:
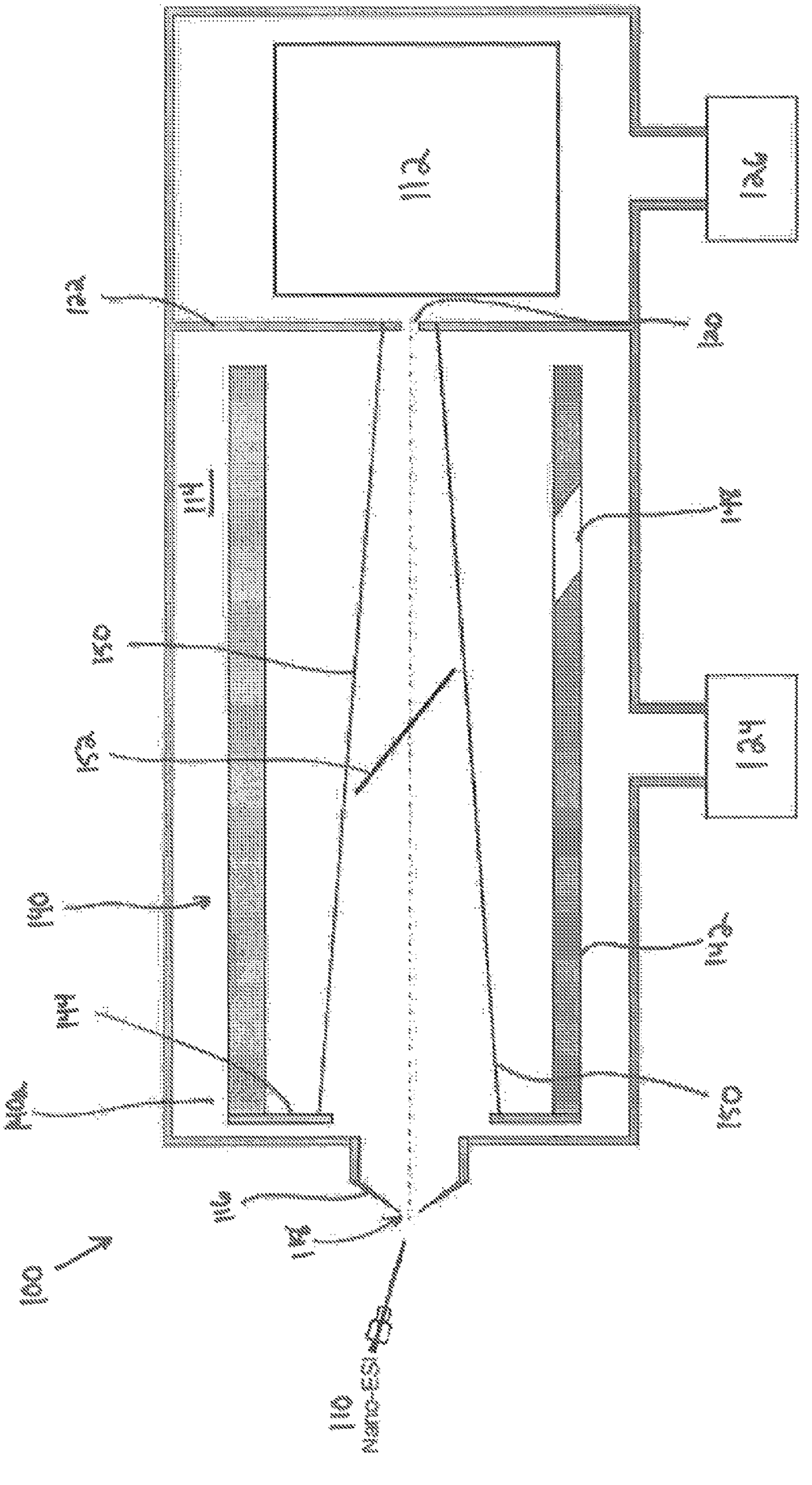
FIG. 1, in schematic diagram, depicts an exemplary mass spectrometer system comprising an ion guide in accordance with one aspect of various embodiments of the applicant's teachings.

In various aspects, a mass spectrometry system and method for transmitting ions is provided. With reference now to FIG. 1, an exemplary mass spectrometry system 100 in accordance with various aspects of applicant's teachings is illustrated schematically. As will be appreciated by a person skilled in the art, the mass spectrometry system 100 represents only one possible configuration in accordance with various aspects of the systems, devices, and methods described herein. As shown in FIG. 1, the exemplary mass spectrometry system 100 generally comprises an ion source 110 for generating ions from a sample of interest, an ion guide 140, and an ion processing device (herein generally designated mass analyzer 112).

Though only mass analyzer 112 is shown, a person skilled in the art will appreciate that the mass spectrometry system 100 can include additional mass analyzer elements downstream from the ion guide 140. As such, ions transmitted through the vacuum chamber 114 containing the ion guide 140 can be transported through one or more additional differentially pumped vacuum stages containing one or more mass analyzer elements. For instance, in some aspects, a triple quadrupole mass spectrometer may comprise three differentially pumped vacuum stages, including a first stage maintained at a pressure of approximately 2.3 Torr, a second stage maintained at a pressure of approximately 6 mTorr, and a third stage maintained at a pressure of approximately $10^{-5}$ Torr. The third vacuum stage can contain, for example, a detector, as well as two quadrupole mass analyzers (e.g., Q1 and Q3) with a collision cell (Q3) located between them. It will be apparent to those skilled in the art that there may be a number of other ion optical elements in the system. This example is not meant to be limiting as it will also be apparent to those of skill in the art that the ion guide described herein can be applicable to many mass spectrometer systems that sample ions from elevated pressure sources. These can include time of flight (TOF), ion trap, quadrupole, or other mass analyzers, as known in the art.

Moreover, though the ion source 110 of FIG. 1 is depicted as an electrospray ionization (ESI) source, a person skilled in the art will appreciate that the ion source 110 can be virtually any ion source known in the art, including for example, a continuous ion source, a pulsed ion source, an electrospray ionization (ESI) source, an atmospheric pressure chemical ionization (APCI) source, an inductively coupled plasma (ICP) ion source, a matrix-assisted laser desorption/ionization (MALDI) ion source, a glow discharge ion source, an electron impact ion source, a chemical ionization source, or a photoionization ion source, among others. By way of non-limiting example, the sample can additionally be subjected to automated or in-line sample preparation including liquid chromatographic separation.

As shown in FIG. 1, the ion guide 140 can be contained within a vacuum chamber 114. In various aspects, the vacuum chamber 114 includes an orifice plate 116 having an inlet orifice 118 for receiving ions from the ion source 110. The vacuum chamber 114 can additionally include an exit aperture 120 in an exit lens 122 through which ions transmitted by the ion guide 140 are passed to a downstream vacuum chamber 116, which houses, for example, one or more ion processing devices (e.g., mass analyzer 112). As will be appreciated by a person skilled in the art, the vacuum chambers 114, 116 can be evacuated to sub-atmospheric pressure as is known in the art. By way of example, mechanical pumps 124, 126 (e.g., turbo-molecular pumps) can be used to evacuate the vacuum chambers 114, 116, respectively, to appropriate pressures.

In various aspects, ions generated by the ion source 110 are transmitted into the vacuum chamber 114 and can be entrained in a supersonic flow of gas as the gas entering the vacuum chamber expands through the inlet orifice 118. This phenomena, typically referred to as supersonic free jet expansion as described, for example, in U.S. Pat. Nos. 7,256,395 and 7,259,371 (each of which is hereby incorporated by reference in its entirety), aids in axially transporting the entrained ions through the vacuum chamber 114. Prior art ion guides that rely solely on RF focusing to transmit the ions into downstream analyzers, however, can experience difficulty in focusing ions in higher pressure environments due to the ions' collision with ambient gas molecules within the supersonic gas flow. As such, prior art systems limit, for example, the size of the inlet orifice so as to maintain the gas flow and pressure within the vacuum chamber at a level such that the entrained ions can still be focused into a narrow beam for transmission into a subsequent chamber for downstream processing.

In accordance with various aspects of the applicant's present teachings, the ion guide 140 according to an embodiment of the present teachings can receive at its inlet end 140*a* the ions entrained within the gas flowing through the inlet orifice 118 generally along a longitudinal, central axis (A) of the ion guide 140, displace the ions from the longitudinal, central axis (A), deflect at least a portion of the gas flow out of the ion guide 140, and transmit the ions to the outlet end 140*b* of the ion guide 140. As shown schematically in FIG. 1, for example, the ion guide 140 can comprise an outer cylinder electrode 142 that extends around the longitudinal, central axis (A) from an upstream inlet plate 144 toward the downstream exit lens 122. The inlet plate 144 can include an inlet aperture 146 axially aligned with the inlet orifice 118 and the exit aperture 120 in the exit lens 122. In some aspects, the exit aperture 120 can have a smaller diameter than the inlet orifice 118. As will be discussed in further detail below, the outer cylinder electrode 142 can additionally include one or more exit window(s) 148 through which at least portion of the gas flow can be removed from the outer cylinder electrode 142.

As noted above, in various aspects, the ion guide 140 can be configured to displace the ions entering the ion guide 140 out of the gas flow and/or away from the central axis (A). By way of example, the mean radial position of an ion as it is transmitted through the ion guide 140 can be offset from the central axis (A). As shown in FIG. 1, for example, the outer cylinder electrode 142 can contain a plurality of conductive wires or rods (hereinafter wires 150) that surround the central axis (A) and extend between the inlet plate 144 of the outer cylinder electrode 142 and the exit lens 122. The wires 150 can have a variety of diameters and configurations, but in the exemplary embodiment depicted in FIG. 1, the upstream ends of the wires 150 can be coupled to the inlet plate 144 and surround the inlet aperture 146, while the downstream ends can be coupled to the exit lens 122 and surround the exit aperture 120. In various aspects, the wires 150 can be non-parallel to the central axis (A) such that they converge as they extend from the inlet end 140*a* to the outlet end 140*b*. Though the exemplary embodiment depicted in FIG. 1 includes four (4) wires (only two of which are depicted) equally spaced around the central axis (A), it will be appreciated that any number of wires 150 (e.g., 2, 6, 8, 12) can be used to produce any number of suitable multipole configurations for use in an ion guide 140 in accordance with applicant's present teachings.

In some aspects, the ion guide 140 can additionally include a deflection plate 152, which can act to deflect the gas flow from the central axis (A) after the ions (or at least a substantial number of ions, e.g., 80% or more) have been extracted from the gas flow. As will be discussed in detail below, the gas deflection plate 152 can have a variety of configurations, but in the exemplary embodiment depicted in FIG. 1, the gas deflection plate 152 can be a planar surface disposed on the central axis (A) of the ion guide 140. Additionally, in some aspects, the gas deflection plate 152 can be angled relative to the major axis of gas flow such that gas deflected therefrom is substantially directed toward the exit window 148 in the outer cylinder electrode 142.

In some aspects, the various elements of the ion guide 140 can have electric potentials applied thereto so as to control the movement of the ions through the ion guide in accordance with the teachings herein. By way of example, the outer cylinder electrode 142 and/or wires 150 can have an electric potential applied thereto so as to generate an electric field configured to displace the ions from the central axis (A) toward the wires 150 of the ion guide 140 (i.e., to impart a radial velocity component, that is, a component perpendicular to the longitudinal central axis (A), thereby separating at least a portion of the ions from the gas flow. As discussed in more detail below, the electric field generated by application of electric potential(s) to the outer cylinder electrode 142 and/or wires 150 can also generate a repulsive force as the deflected ions become too close to the wires 150 (this can be achieved, for example, by application of a radiofrequency (RF) electric potential to the wires 150) such that the deflected ions will not strike the wires 150, but rather be guided in proximity of the wires 150 downstream toward the exit aperture 120. In other words, an electrical potential well can be generated in the vicinity of the wires 150 to substantially trap the deflected ions as they approach the wires. The ions can then move under the influence of their initial axial momentum in the vicinity of the wires 150 to the exit aperture 120. By way of non-limiting example, the ions can be removed from the gas stream (e.g., displaced at least 10 mm from the central axis in some embodiments) and can be transported downstream while remaining in proximity to the wires 150 (e.g., within less than about 5 mm to the wires). In some cases, the electric field can be characterized as a superposition of an octapole DC field and a quadrupole RF field so as to generate a substantially monopole or monopole equivalent RF field in the portion of the ion guide 140. As will be appreciated by a person skilled in the art, a monopole equivalent RF field indicates that the monopole component is dominant while the quadrupole component can be negligible such that the stable ion position is not on the central axis as discussed in detail below.

Figures 2A, 2B, 2C:
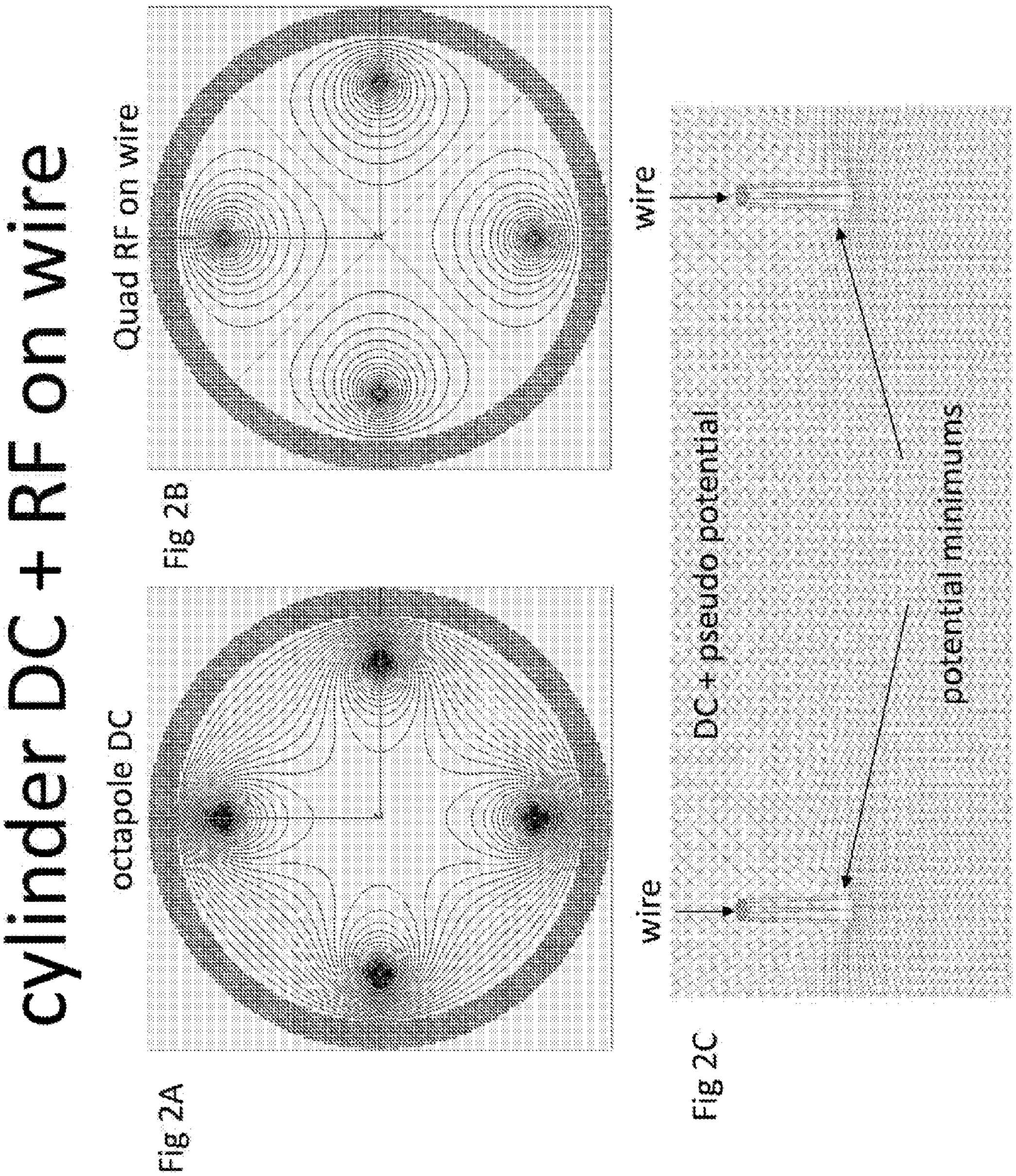
FIGS. 2A-2C depict a simulated electric field generated in the ion guide of FIG. 1.

In various embodiments, one or more power supplies (not shown) can be configured to provide a DC voltage and/or an RF voltage to the orifice plate 116, the outer cylinder electrode 142, the deflection plate 152, the exit lens 122, and the wires 150. By way of example, in the exemplary embodiment depicted in FIG. 1, a power source (not shown) can be configured to apply a DC voltage to the outer cylinder electrode 142 while a second power source (not shown) can apply a RF signal to the four wires 150. Simulated field lines for such a configuration are depicted in FIGS. 2A-2C. With reference first to FIG. 2A, simulated equipotential field lines are depicted when only a DC bias is applied to the outer cylinder electrode 142 relative to the four wires 150, thereby generating a substantially DC octopole field. As such, if the DC bias on the cylinder electrode 142 relative to the wires 150 is of the same polarity of the ions of interest, the ions will be attracted to the wires 150 (i.e., away from the central axis (A)).

With reference now to FIG. 2B, simulated field lines are depicted with only an RF signal being applied to the wires 150 (i.e., without a DC bias applied to the outer cylinder electrode 142). As will be appreciated by a person skilled in the art, in some aspects, different RF signals can be applied to the two pairs of opposed wires 150. By way of example, a first pair of opposed wires 150 can have a RF voltage applied thereto with the second pair of opposed wires 150 can having a second RF voltage of equal magnitude but 180° out of phase so as to create a balanced RF quadrupole field on the central axis (A) along the length of the wires 150. Alternatively, unbalanced RF signals can be applied to the wires. Regardless of the polarity of the ions of interest, the RF signal will act to repel the ions away from the wires 150.

With reference now to FIG. 2C, it will be appreciated that by simultaneously applying the DC bias voltage to the cylinder electrode 142 as shown in FIG. 2A and an RF signal to the wires 150 as shown in FIG. 2B, potential minimums are created adjacent the wires 150 for ions of opposite polarity to that of the DC bias. As such, ions entering the ion guide will tend to accumulate adjacent and/or around the wires 150 (i.e., offset from the central axis (A)).

As will be appreciated by a person skilled in the art, the gas deflection plate 152 can also have an electric potential applied thereto so as to control the movement of the ions as they are transmitted through the ion guide 140. By way of example, the gas deflection plate 152 can be coupled to a power source (not shown) such that a DC bias relative to the wires can be applied thereto so as to provide a repulsive force to the ions of interest (in some embodiments, the gas deflection plate 152 can be grounded). As such, as the ions approach the gas deflection plate 152, the repulsive force can aid in drawing the ions toward the wires 150 and deflecting the ions around the gas deflection plate 152 and away from the central axis (A).

Moreover, as will be appreciated by a person skilled in the art and modified in accordance with the applicant's present teachings, each of the orifice plate 116 and exit lens 122 can have an electric potential applied thereto to aid in passing the ions through the inlet orifice 118 and exit aperture 120.

Figure 3:
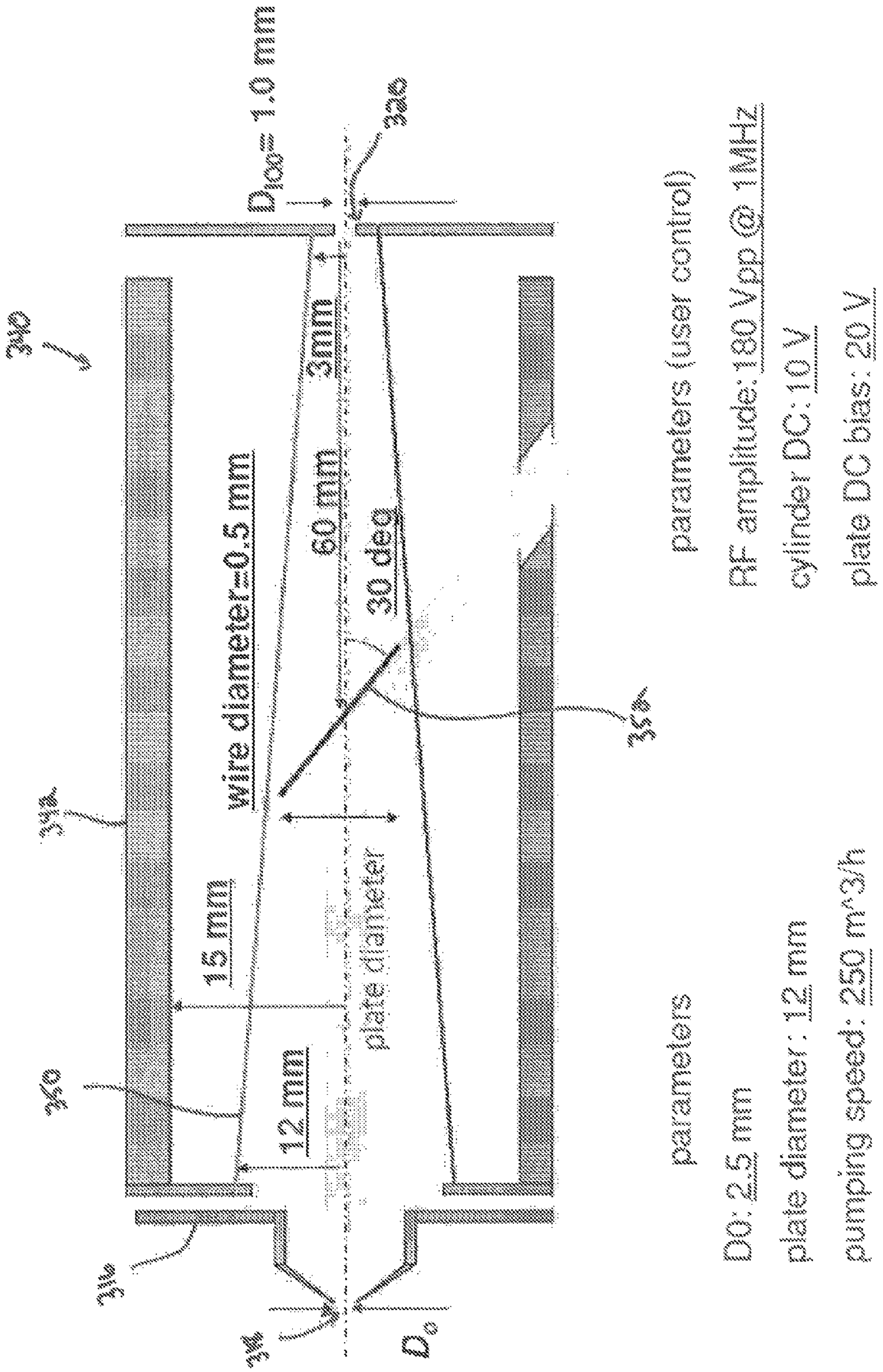
FIG. 3, in schematic diagram, depicts another exemplary ion guide in accordance with one aspect of various embodiments of the applicant's teachings.

With reference now to FIG. 3, one exemplary set-up for an ion guide in accordance with the applicant's teaching is depicted. As will be appreciated by one skilled in the art, the values and parameters provided with respect to the ion guide 340 are but one non-limiting example of applicant's present teachings and are not intended to limit the applicant's teachings. On the contrary, the applicant's teachings encompass various alternatives, modifications, and equivalents, as will be appreciated by those of skill in the art. As with the ion guide 140 discussed above, the ion guide 340 can be contained within a vacuum chamber and configured to receive ions through an inlet orifice 318 of an orifice plate 316. A pump (not shown) can be operated to evacuate the vacuum chamber containing the ion guide 340 to an appropriate sub-atmospheric pressure. By way of example, the pump can be selected to operate at a speed of about 250 $m^3$/hr to generate a sub-atmospheric pressure within the vacuum chamber. By way of example, the pump can be selected to operate to evacuate the chamber to pressures in the range from about 1 Torr to about 20 Torr. The inlet orifice 340 can have a variety of sizes, for example, the inlet orifice can have a diameter of about 2.5 mm. The supersonic gas flow in which the ions are entrained can enter the inlet end of the ion guide 340 along the central axis (A) and between four wires 350, each having a diameter of about 0.5 mm and spaced from the central axis by about 12 mm at the inlet end and about 3 mm at the outlet end. The outer cylinder electrode 342 can be of a variety of sizes, though in the embodiment in FIG. 3, for example, the outer cylinder electrode 342 can have an inner radius of about 15 mm along its length. The deflection plate 352, which can be placed at an angle of about 30 degrees relative to the central axis (A), can have a diameter of about 12 mm orthogonal to the central axis (A). In the exemplary embodiment depicted in FIG. 3, the deflection plate 352 can be centered about the central axis (A) and positioned about 60 mm from the exit lens 322. The ions that are focused by the ion guide 322 are transmitted through the exit aperture 320, which can have a diameter of about 1.0 mm.

In various aspects, several parameters in the ion guide 340 can be selected by the user. By way of example, a user can select the RF signal applied to the wires 350. In the depicted embodiment, for example, the user can set the RF signal to be 180$V_{pp}$ at 1 MHz. As discussed above, the cylinder electrode 342 can be biased, for example, at 10V DC relative to the wires 350. The deflection plate 352, which can also have a DC voltage applied thereto can have, for example, a 20V DC offset relative to the wires 350 so as to increase the deflection of the ions around the deflection plate 352.

Figure 4:
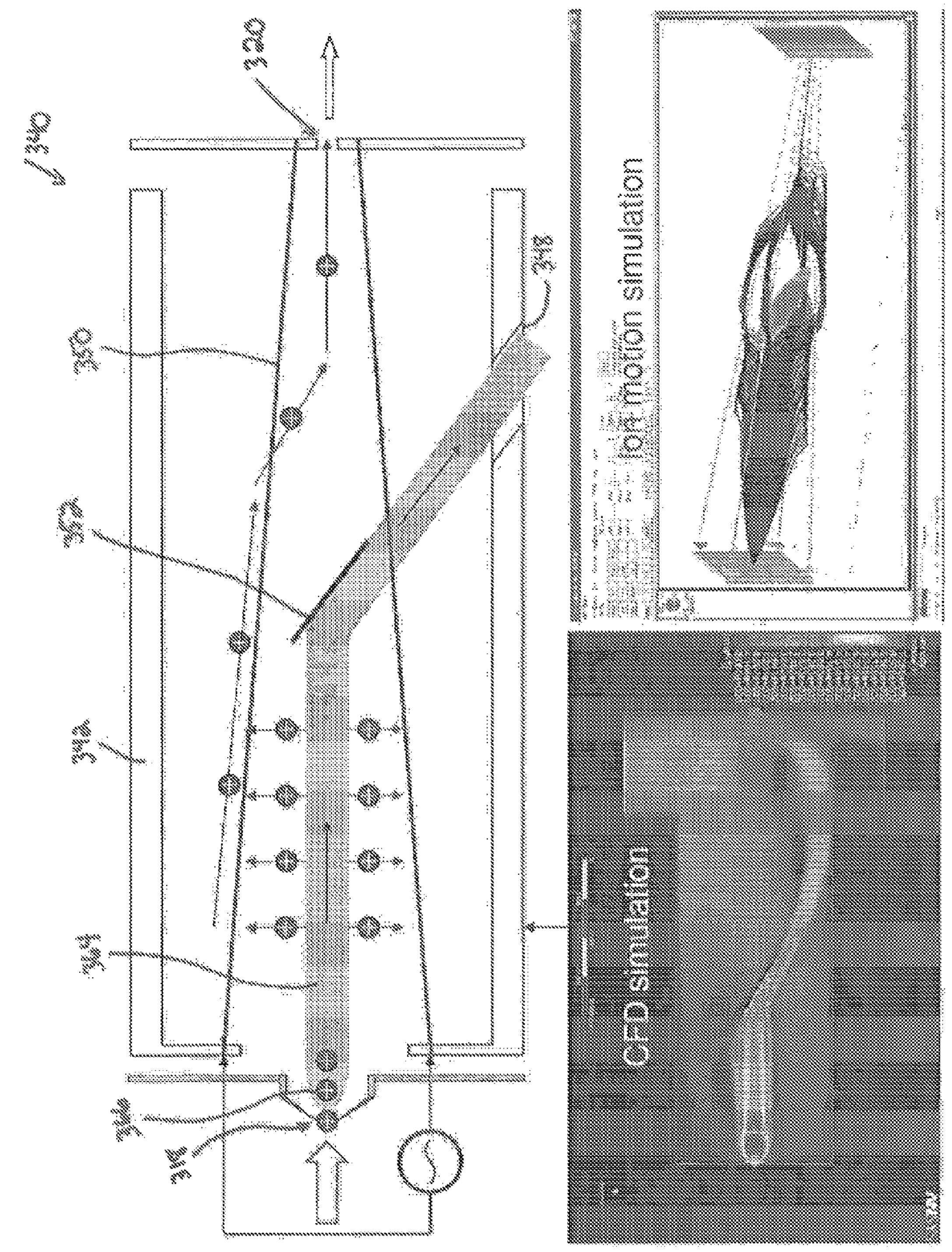
FIG. 4 depicts a simulated gas flow and ion motion in the ion guide of FIG. 3.

In use, the ion guide 340 of FIG. 3 can receive ions from an ion source, separate the ions from the supersonic gas flow generated at the inlet orifice 318, and focus the ions through the exit aperture 320 for further downstream processing. With reference now to FIG. 4, the gas dynamics and movement of the ions in the ion guide 340 will be described in more detail. As shown in the schematic, ions enter the inlet orifice 318 entrained in a supersonic gas flow 364 after being generated by an ion source (not shown). With specific reference to the CFD (Computational Fluid Dynamics) simulation, a person skilled in the art will appreciate that the gas entering the inlet orifice 318 undergoes free jet expansion and then slows down and recompresses forming what is commonly referred to as a Mach disk. After recompressing, the radial boundaries of the gas flow are generally defined by a barrel shock structure. Upon entry of the ions 366 into the ion guide 340, the positive ions 366 that are initially entrained in the gas flow, for example, are drawn toward the wires 350 due to the octapole DC field generated by a positive DC bias of the outer cylinder electrode 342 relative to the wires 350. With specific reference to the ion motion simulation, a person skilled in the art will appreciate that ions having a smaller m/z ratio are generally deflected from the central axis (i.e., out of the gas flow) earlier than those ions having a larger m/z ratio. The ions continue to traverse the ion guide 340 due to the axial velocity imparted thereto by the gas flow. As the gas flow 364 and ions 366 approach the deflection plate 352, the ions are further deflected around the gas deflection plate 352 (i.e., away from the central axis) due to the repulsive force generated based on the plate's DC bias relative to the wires 350. The gas flow is also deflected from the central axis, as shown in the CFD simulation, and can be removed from the ion guide 340 through an exit window 348 in the outer cylinder electrode 342. Because a substantial portion of the gas flow is removed, the RF focusing provided by the converging wires 350 downstream of the deflection plate 352 can be effective (e.g., due to fewer collisions with ambient gas molecules) in narrowly focusing the ions into an ion beam for transmission through the exit aperture 320.

FIG. 5 depicts another exemplary ion guide 540 in accordance with various aspects of the applicant's teachings. The ion guide 540, like the ion guide 140 discussed above with reference to FIG. 1, comprises an outer cylinder electrode 542 extending from an inlet end 540*a* to an outlet end 540*b*. As above, wires 550 extend through the outer cylinder electrode 542 and converge as they traverse the ion guide 540 from the inlet plate 544 to the exit lens 522. The inlet plate 544 additionally includes an inlet aperture 546 through which ions and gas flow can be received from an inlet orifice (not shown). The exit lens 522 includes an exit aperture 520 through which an ion beam can be transmitted to downstream mass analyzer(s) for further processing. Similar to the embodiment discussed above with reference to FIG. 1, each of the inlet aperture 546 and the exit aperture 520 can be disposed on the central axis of the ion guide 540.

The ion guide 540 differs from the ion guide 140 discussed above, for example, in that the gas deflection plate 552 is not angularly oriented relative to the central axis. Rather, the plane of the gas deflection plate 552 is substantially orthogonal to the central axis (and the central direction of gas flow). One or more exit windows 548 extend through the outer cylinder electrode 542 adjacent the deflection plate 552 to receive the gas deflected by the gas deflection plate 552 away from the central axis. In some aspects, the outlet end 540*b* of the outer cylinder electrode 542 can additionally include one or more exit windows 554 to draw additional gas out of the ion guide 540 prior to the ion beam being transmitted through the exit aperture 520.

Figures 5A, 5B, 5C, 5D:
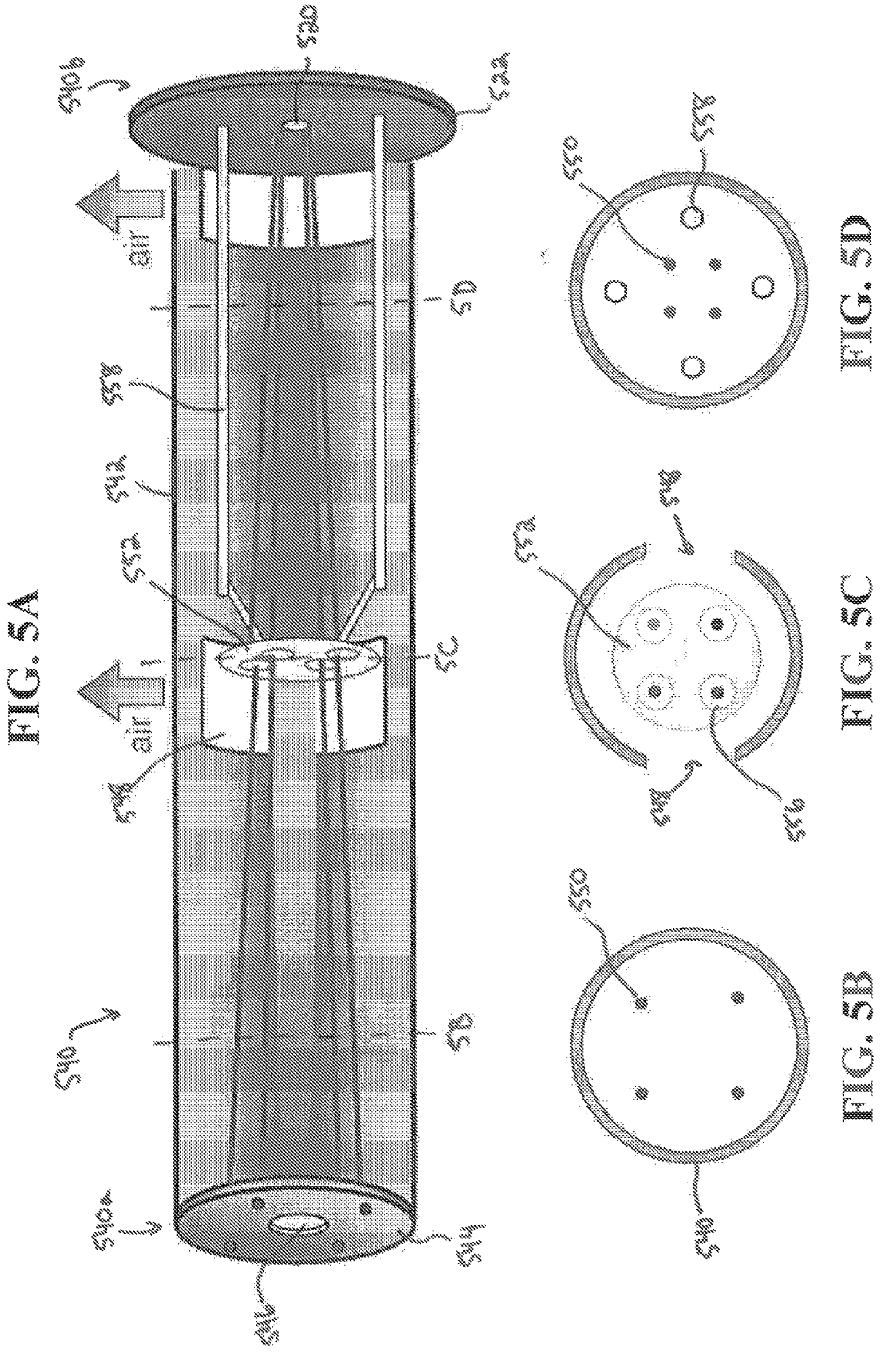
Figure 6:
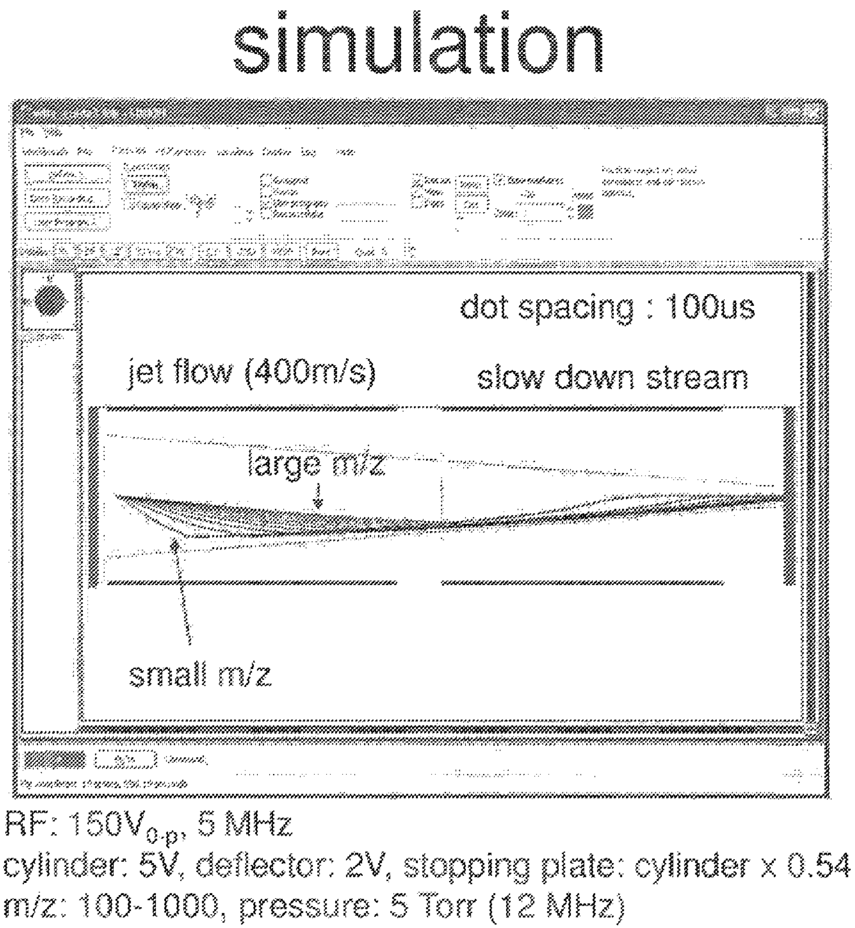
FIG. 6 depicts a simulated path for ions of various m/z ratios transmitted through the ion guide of FIGS. 5A-5D.

Additionally, whereas the deflection plate 152 discussed above with reference to FIG. 1 is disposed within the circumference defined by the wires 150, the deflection plate 552 depicted in FIGS. 5A and 5C instead includes one or more bores 556 through which each of the wires 550 extend. As such, after the ions are drawn out of the gas flow and towards the wires 550 due to a DC bias between the outer cylinder electrode 542 and the wires 550, the ions can be transmitted along the wires through the bores 556 in the deflection plate 552 and then refocused toward the central axis, as depicted, for example in the ion motion simulation of FIG. 6.

In various aspects, the ion guide 540 can also include additional electrodes disposed downstream of the deflection plate 552. By way of non-limiting example, four rods 558 can be disposed around the circumference of the converging wires 550, as shown in FIG. 5D. By applying an RF signal, for example, to the four rods 558, the rods can aid in refocusing the ions to be transmitted by the ion guide 540.

Figures 7A, 7B, 7C, 7D:
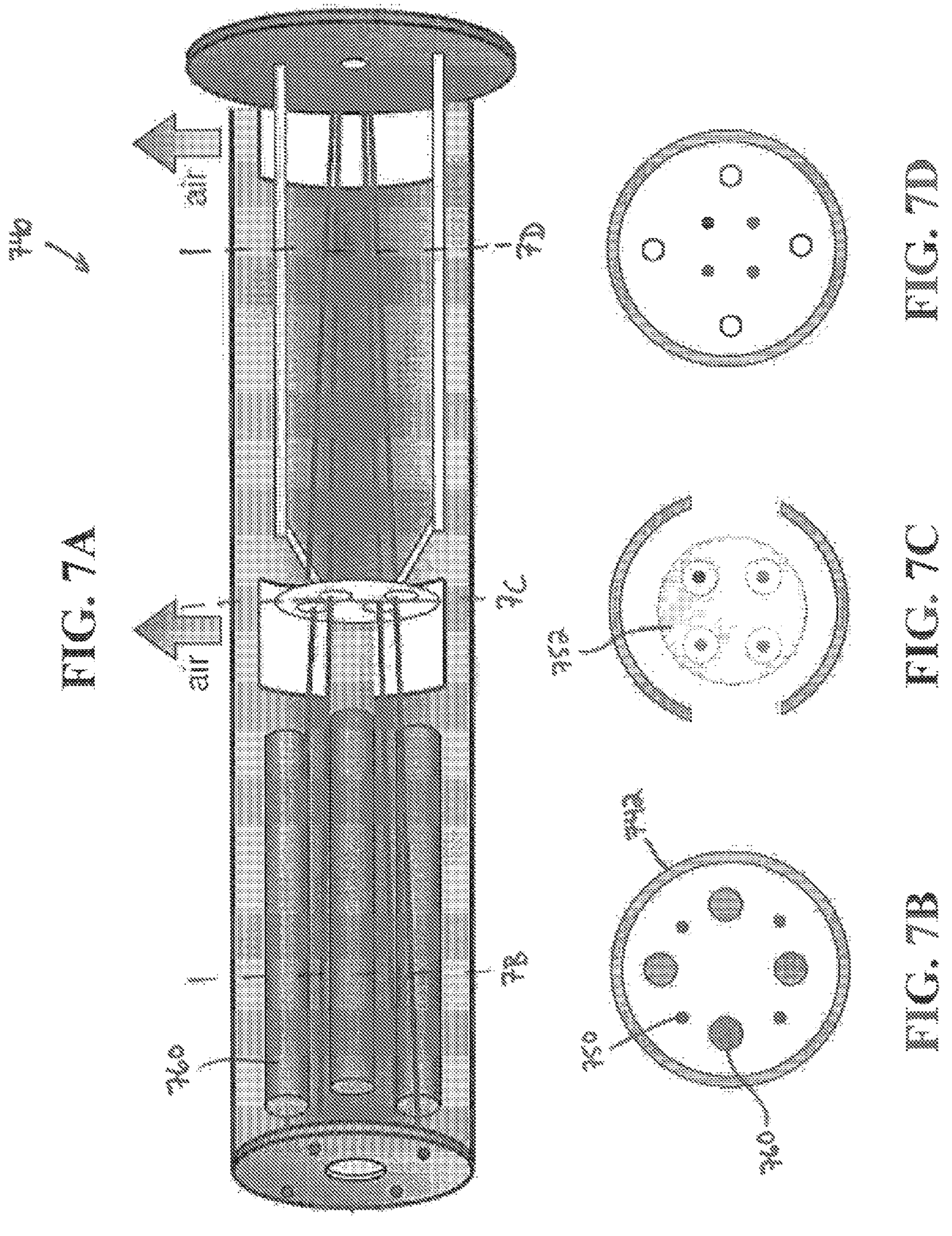
FIGS. 7A-7D, in schematic diagram, depict another exemplary ion guide in accordance with one aspect of various embodiments of the applicant's teachings.

With reference now to FIG. 7, another exemplary embodiment of an ion guide 740 in accordance with various aspects of the applicant's present teachings is depicted. The ion guide 740 is substantially identical to the ion guide 540 discussed above with reference to FIG. 5, but additionally includes rods 760 disposed within the outer cylinder electrode 742 upstream of the deflection plate 752. Any number of rods 760 can be used and can have a variety of configurations, though in the depicted embodiment, the ion guide 740 includes four rods 760 that extend longitudinally and parallel to the central axis and are disposed between adjacent wires 750. The rods 760 can be coupled to a power source (not shown) such that a DC bias can be applied to the rods relative to the wires and the outer cylinder electrode 742. In some embodiments, the applied DC bias can generate a DC dipole field across the central axis of the ion guide 740 along the length of the rods 760 to further aid in radial extraction of ions from the gas flow. In using such a configuration, the rods 760 may be able extract ions more quickly from the gas flow than the octapole DC field generated by a DC bias applied on the outer cylinder electrode 742 relative to the wires 750 alone. As such, the ion guide 740 may enable more ions to be isolated from the gas flow, thereby potentially improving sensitivity of the device.

Figure 8:
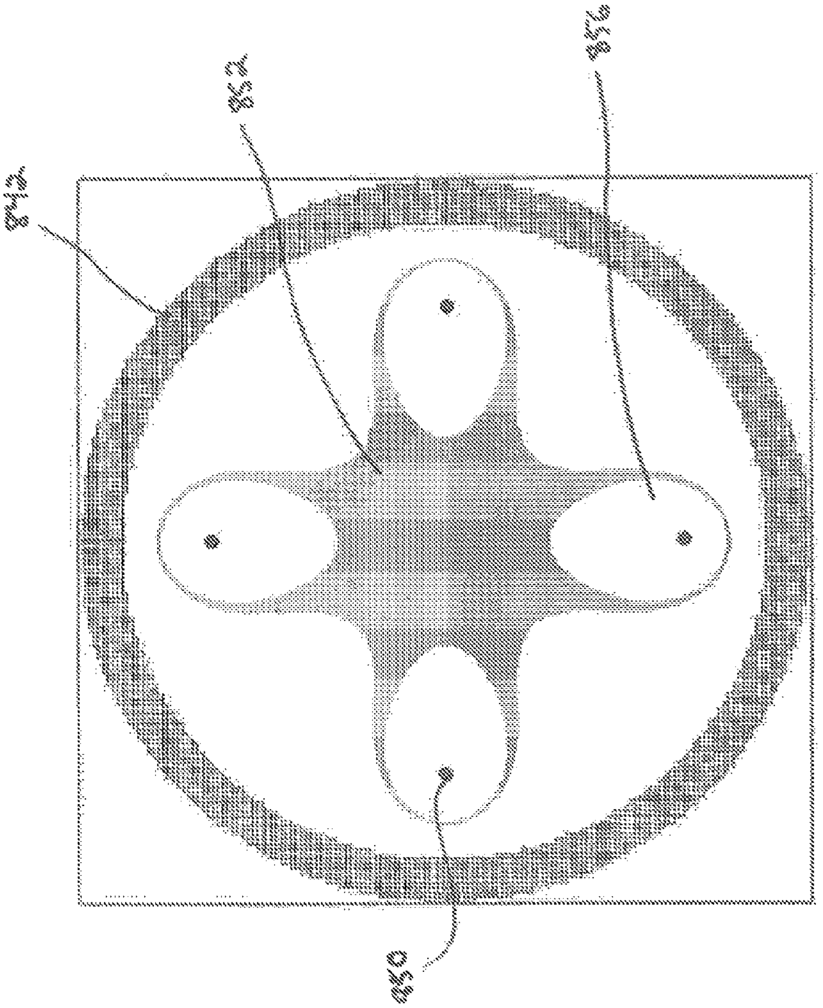
FIG. 8 depicts an exemplary deflection plate for use in an ion guide in accordance with one aspect of various embodiments of the applicant's teachings.

Though the deflection plates 552, 772 of FIGS. 5 and 7 are depicted as being substantially circular, a person skilled in the art will appreciate that the deflection plate can have a variety of configurations and can be positioned in a variety of ways relative to the central direction of gas flow. For example, as discussed above with reference to FIG. 1, the deflection plate 152 can be angularly oriented relative to the central axis (and major axis of gas flow) such that deflection of the gas flow can be substantially directed to a pre-determined portion of the outer cylinder electrode 142 (e.g., exit window 148). Moreover, the gas deflection plate can be shaped so as to control the transmission of ions through its bores. By way of example, with reference now to FIG. 8, the gas deflection plate 852 can be shaped such that it has substantially the same shape of the equipotential surface generated at the plate 852 by the outer cylinder electrode 842 and the wires 850 as otherwise discussed herein. As above, the gas deflection plate 852 can include a plurality of bores 856, through which each of the wires 850 pass.

Figures 9A, 9B, 9C, 9D, 9E, 9F:
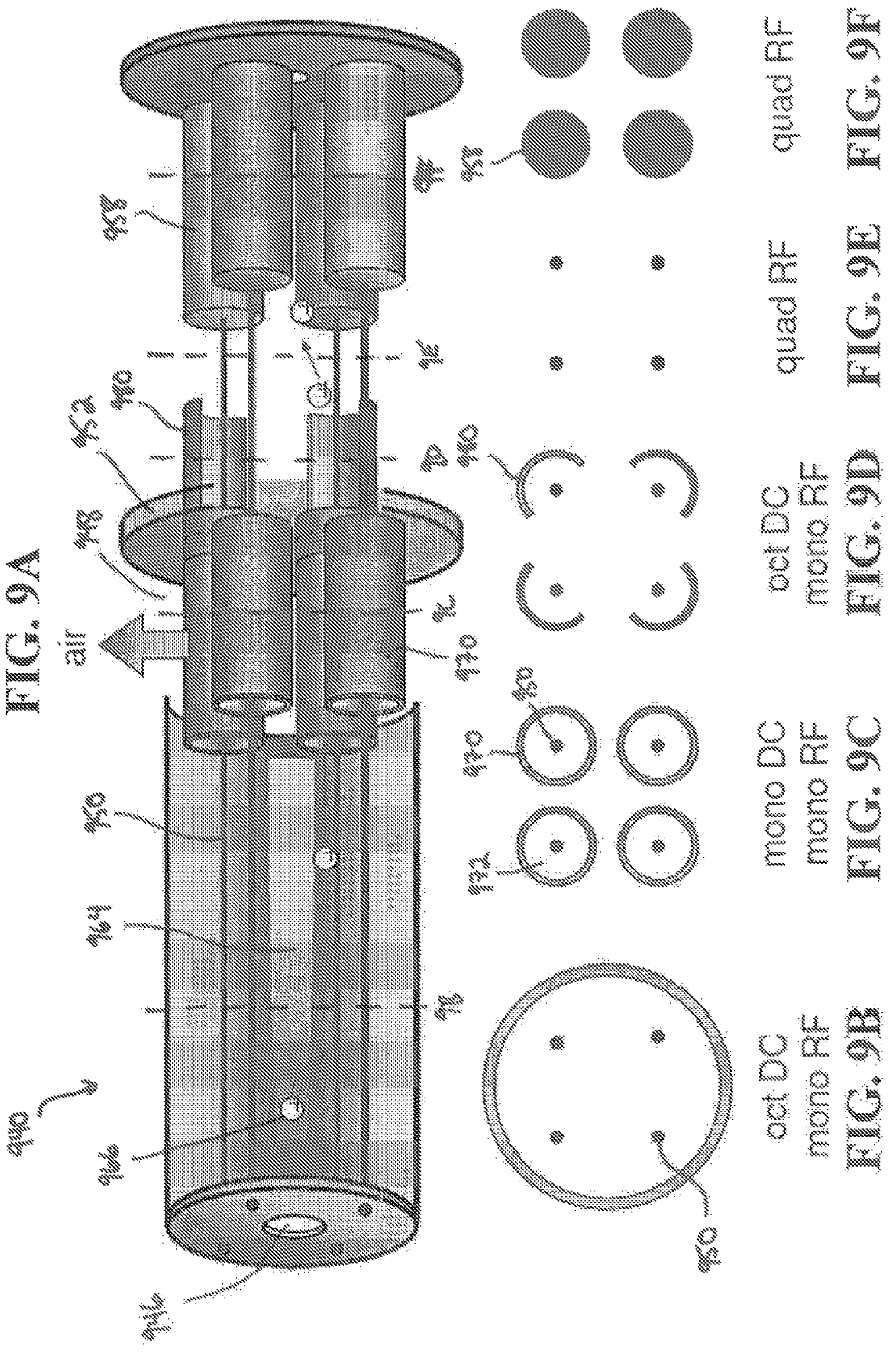
FIGS. 9A-9F, in schematic diagram, depict another exemplary ion guide in accordance with one aspect of various embodiments of the applicant's teachings.

Moreover, it will be appreciated that the wires can have a variety of configurations (e.g., size, angular orientation) and a variety of DC and RF voltages can be applied thereto to cause ions to be drawn out of the gas stream and accumulate around the wires. For example, though the wires described above are non-parallel and converging as they approach the downstream end of the exemplary ion guides, the wires can alternatively exhibit a parallel orientation. With reference now to FIG. 9, another exemplary ion guide in accordance with various aspects of applicant's present teachings is depicted. As above, the ion guide 940 can be disposed in a vacuum chamber (or define an area of sub-atmospheric pressure) and can be configured to receive a gas stream 964 containing sample ions 966 from an ion source, separate the ions 966 from the gas stream 964, and transmit the ions 966 for downstream processing. As shown in FIG. 9, the first portion of the ion guide 940 (see FIG. 9B) can include parallel wires 950 for drawing the ions out of the gas flow, as substantially described above with reference to the ion guide 140 of FIG. 1. That is, an outer cylinder electrode 942 can exhibit a DC bias relative to the parallel wires 950 disposed about the central axis of the ion guide 940 and outside of the barrel shock structure of the gas flow entering the inlet aperture 946 of the guide 940 so as to generate a DC octapole field configured to draw the ions out of the gas flow and toward the wires 950. Simultaneously, the wires 950 can have an RF signal applied thereto so as to generate a repulsive force, thereby creating a potential well for accumulating the ions adjacent and/or around the wires 950 (i.e., offset from the central axis), as shown for example in the simulation of FIG. 10, and as discussed otherwise herein.

As shown in FIG. 9C, the second portion of the ions guide 940 includes inner cylinder electrodes 970 extending upstream from the gas deflection plate 952. Each of inner cylinder electrodes 970 includes a bore 972 that is aligned with a bore in the gas deflection plate 952 and through which the wires 950 can extend. As will be appreciated by a person skilled in the art, the inner cylinder electrodes 970 can be maintained at a DC bias relative to the wires 950 such that the ions travelling through each is trapped by the combination of the repulsive, monopole DC field generated by the DC bias on the inner cylinder electrode 970 and the RF field generated by the wires 950. As a result, ions can be transmitted into the inner cylinder electrodes 970 and through the bores extending through the deflection plate 952, while at least a portion of the gas flow 964 entering the ion guide 940 is deflected by the deflection plate 952 out of the exit window 948 and away from the central axis, as discussed elsewhere herein.

With at least a portion of the gas flow 964 removed from the central axis of the ion guide 940, the ions enter the third portion in which semi-cylinder electrodes 980 extend downstream from the gas deflection plate 952, as shown in FIG. 9D. The wires 950 additionally extend through the semi-cylinder electrodes 980. As will be appreciated by a person skilled in the art, the semi-cylinder electrodes 980 can be maintained at a DC bias relative to the wires 950 such that the ions entering each of the semi-cylinder electrodes 980 are generally pushed toward the central axis of the ion guide 940 due to the combination of the octopole DC field and RF field generated by the wires 950 and semi-cylinder electrodes 980, as shown for example in the simulation of FIG. 10.

The wires 950, which continue to extend downstream, comprise a fourth portion of the ion guide 940 (see FIG. 9E). As will be appreciated by a person skilled in the art, the configuration of the wires 950 in this fourth portion generates a quadrupole RF field, which further urges the ions towards the central axis, as shown for example in the simulation of FIG. 10.

Figure 10:
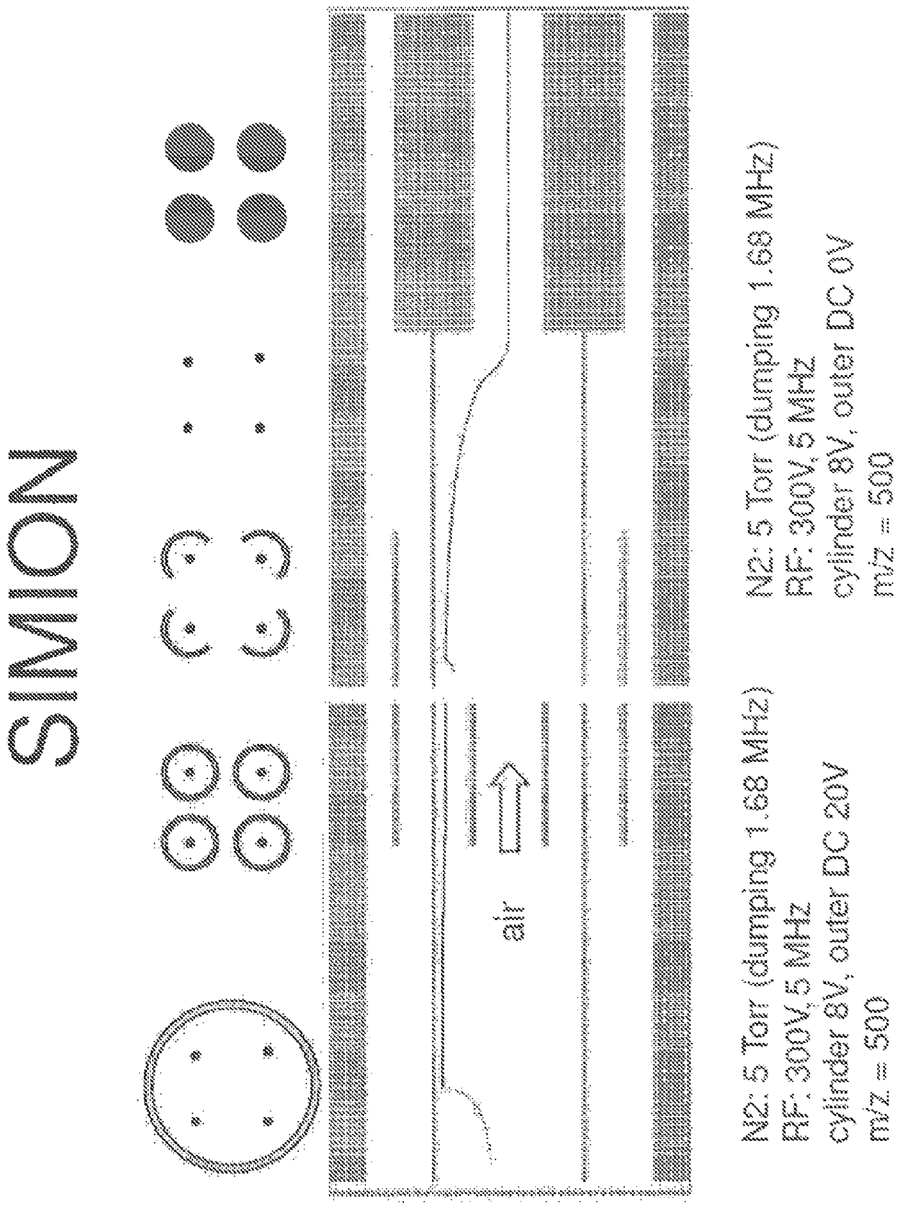
FIG. 10 depicts a simulated path for an ion transmitted through the ion guide of FIGS. 9A-9F.

The downstream end of each wire 950 can be coupled, for example, to a corresponding rod 958 that comprises the fifth portion of the ion guide 940. The rods 958, which can have an RF signal applied thereto, can generate a quadrupolar RF field that produces a greater focusing force on the ions such that the ions can be transmitted through the exit aperture as a coherent ion beam, as depicted in FIG. 10.

Figure 11:
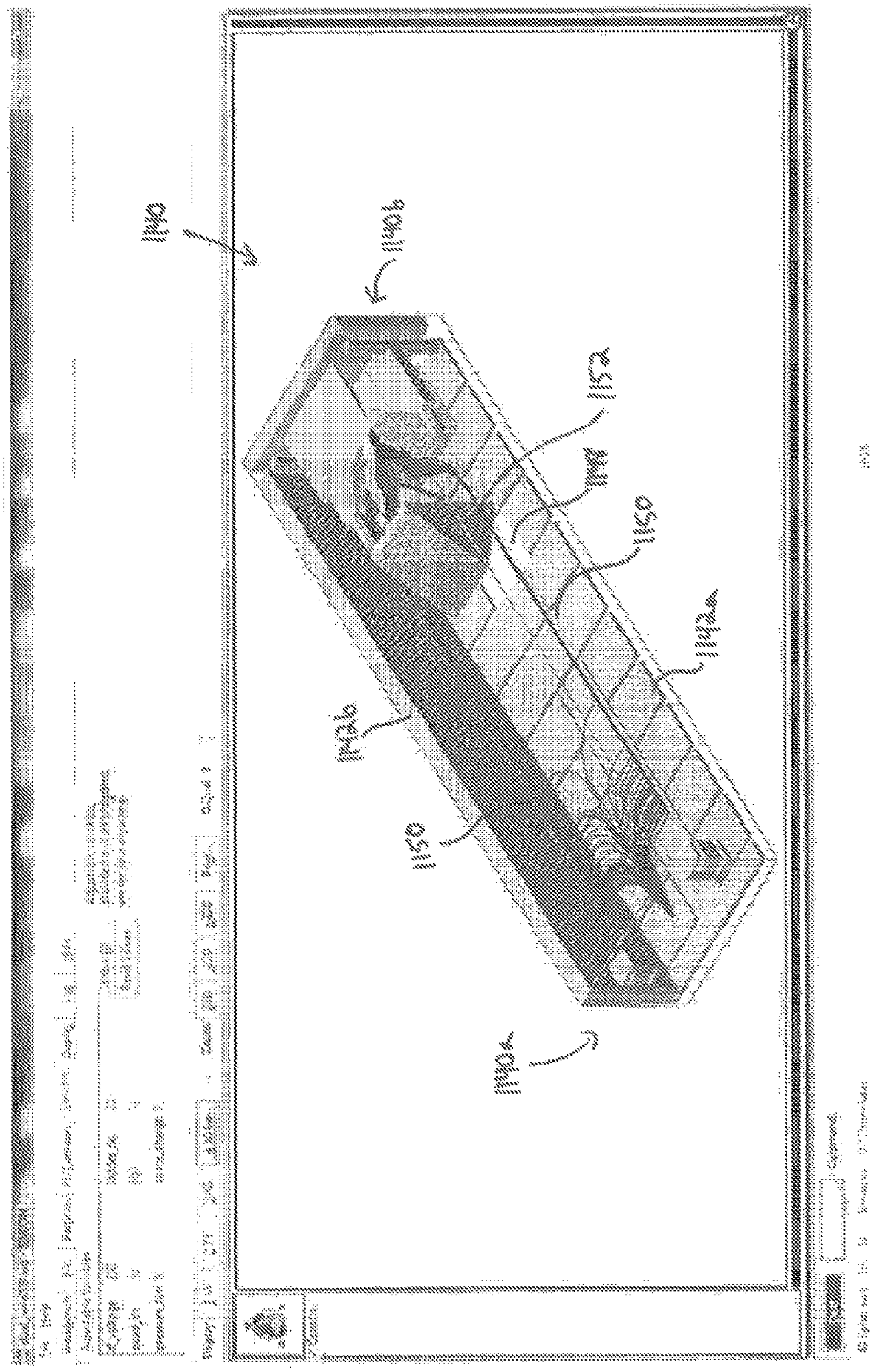
FIG. 11, in schematic diagram, depicts another exemplary ion guide in accordance with one aspect of various embodiments of the applicant's teachings.

As noted above, ion guides in accordance with the applicant's present teachings can include any number of wires to cause at least a portion of ions entrained in a gas flow to be extracted from the gas jet and be guided downstream along one or more paths separate from the path of gas flow (the gas lacking the ions can be removed from the ion guide). With reference now to FIG. 11, another exemplary embodiment of an ion guide 1140 in accordance with various aspects of the applicant's present teachings is depicted. As shown in FIG. 11, the exemplary ion guide 1140 extends from an inlet end 1140*a* to an outlet end 1140*b* and includes top and bottom opposed electrodes 1142*a* extending therebetween (only the bottom electrode 1142*a* is depicted). In an exemplary embodiment, the electrodes 1142*a* can comprise printed circuit boards (PCBs), for example, to which electrical signals can be applied to control the movement of ions along their length. Additionally, two opposed sidewalls 1142*b* can extend from the inlet end 1140*a* to the outlet end 1140*b* (only one of the sidewalls 1142*b* is depicted) upon which two wires 1150 can be mounted and extend along the length of the ion guide 1140.

In some aspects, a DC bias voltage can be applied to the opposed electrodes 1142*a* relative to the wires 1150, while an RF signal is applied to the wires 1150 so as to generate a potential well in the vicinity of the wires 1150, as otherwise discussed herein. By way of example, the electrical signals can generate a quadrupole DC field and a substantially monopole or monopole equivalent RF field in the portion of the ion guide 1140 upstream from the gas deflector 1152. As will be appreciated by a person skilled in the art, a monopole equivalent RF field indicates that the monopole component is dominant while the quadrupole component can be negligible such that the stable ion position is not on the central axis.

Upon entering the ion guide 1140, ions can therefore be deflected from the central axis to traverse the ion guide 1140 outside of the gas jet. As above, a gas deflection plate 1152 disposed on the central axis of the ion guide 1140 can deflect the gas toward one or more exit windows 1148 to remove the gas from the ion guide once the ions have been extracted from the gas flow.

In various aspects, the ion guide 1140 can include additional electrodes 1158 disposed downstream of the deflection plate 1152 to refocus the ions to be transmitted by the ion guide. By way of example, an RF signal can be applied to the electrodes 1158 so as to generate a quadrupole RF field to focus the ion through an outlet aperture in the outlet end 1140*b*.

Though the initial axial velocity of ions entering the ion guides discussed herein can in some aspects be sufficient to transport the ions along the length of the ion guide once removed from the gas jet, it will be appreciated that the axial motion of the ions can be supplemented, for example, by generating an axial DC field within the ion guide. By way of example and as depicted in FIG. 11, the PCB electrodes 1142*a* can be segmented along their length with various DC voltages applied thereto so as to generate a DC "ladder" to accelerate or slow ions' axial movement as they traverse the ion guide 1140.

The section headings used herein are for organizational purposes only and are not to be construed as limiting. While the applicant's teachings are described in conjunction with various embodiments, it is not intended that the applicant's teachings be limited to such embodiments. On the contrary, the applicant's teachings encompass various alternatives, modifications, and equivalents, as will be appreciated by those of skill in the art.

The invention claimed is:

1. An ion guide, comprising:

an enclosure extending longitudinally around a central axis from a proximal inlet end to a distal outlet end, the proximal inlet end being configured to receive a plurality of ions entrained in a gas flow flowing through an inlet orifice;

a deflection plate disposed within said enclosure between the proximal and distal ends, said plate deflecting at least a portion of the gas flow away from a central direction of the gas flow; and a plurality of electrically conductive, elongate elements extending from the proximal end to the distal end within said enclosure, said elongate elements generating an electric field via a combination of RF and DC electric potentials applied to at least one of the enclosure and the elongate elements, said electric field deflecting said entrained ions away from the central direction of the gas flow proximal to said deflection plate and confining said deflected ions in proximity of said elongated elements as said ions travel downstream.

2. The ion guide of claim 1, wherein said electric field is further configured to focus said deflected ions into an ion beam between said deflection plate and the distal end of said enclosure.

3. The ion guide of claim 2, further comprising an exit aperture through which the ion beam exits the ion guide, and optionally, wherein the inlet orifice, exit aperture, and deflection plate are disposed on the central axis.

4. The ion guide of claim 1, wherein the enclosure comprises an electrically conductive cylinder electrode, and optionally, wherein the electrically conductive elements comprise wires.

5. The ion guide of claim 4, wherein said wires comprise two wires extending from the proximal to the distal end, and optionally, wherein the enclosure has two opposed sides comprising printed circuit boards.

6. The ion guide of claim 5, wherein the electric field comprises a quadrupole DC field and a substantially monopole RF field upstream of the gas deflector.

7. The ion guide of claim 6, wherein an RF signal is applied to the wires and a DC bias is applied to at least a portion of the enclosure relative to the wires, and optionally, wherein the RF signal applied to each of the wires is in phase.

8. The ion guide of claim 4, wherein said wires comprise four wires extending from the proximal end to the distal end, and optionally, wherein the electric field comprises an octapole DC field and a substantially monopole RF field upstream of the gas, and optionally, wherein the wires are evenly spaced about the central axis.

9. The ion guide of claim 8, wherein a first RF signal is applied to one pair of opposed wires and a second RF signal is applied to the other pair of opposed wires, and optionally, wherein the first and second RF signals are out of phase.

10. The ion guide of claim 4, wherein the wires are angled such that a minimum distance between the proximal end of the wire and the central axis is smaller than a minimum distance between the distal end of the wire and the central axis.

11. The ion guide of claim 1, wherein said elongate elements are offset relative to said central axis such that they are outside the gas flow at the proximal end.

12. The ion guide of claim 1, wherein the enclosure defines an exit window extending through a sidewall thereof.

13. The ion guide of claim 12, wherein the deflection plate is configured to deflect the gas flow towards the exit window, and optionally, wherein the deflection plate is non-orthogonally angled relative to the central axis.

14. The ion guide of claim 1, wherein the deflection plate comprises a plurality of bores, and optionally, wherein the elongate elements extend through the bores.

15. The ion guide of claim 1, wherein the elongate elements extend around the deflection plate.

16. The ion guide of claim 1, wherein the enclosure is maintained at a vacuum pressure in a range of about 1 to about 20 Torr.

17. A method of transmitting ions, comprising receiving a plurality of ions entrained in a gas flow at an inlet end of an enclosure, said enclosure extending longitudinally around a central axis from a proximal inlet end to a distal outlet end;

applying RF and DC electric potentials to at least one of the enclosure and a plurality of electrically conductive, elongate elements within said enclosure and extending from said proximal end to said distal end, said electric field deflecting at least a portion of said entrained ions away from the central axis and confining said deflected ions in proximity of at least one said elongated elements as ions travel toward said distal outlet end, deflecting at least a portion of the gas flow to an opening for exiting the enclosure subsequent to deflecting said deflected ions.

18. The method of claim 17, further comprising confining said deflected ions in proximity of said elongated elements as said ions travel downstream.

19. The method of claim 17, further comprising focusing at least a portion of said deflected ions travelling beyond said deflection plate toward said central axis in a region distal to said deflection plate.

20. An ion guide, comprising:

a proximal, inlet plate having an inlet aperture configured to receive a plurality of ions entrained in a gas flow;

a distal, outlet plate having an outlet aperture configured to transmit a plurality of ions to a mass analyzer;

a plurality of electrically conductive elements surrounding a central axis and extending within a region between said inlet plate and said outlet plate; and a deflection plate disposed between said inlet and outlet plates, said deflection plate configured to deflect at least a portion of the gas flow away from a central direction of the gas flow, wherein said electrically conductive elements are configured to separate said entrained ions from said gas flow proximal to said deflection plate and focus said separated ions along the central axis distal to said deflection plate.

* * * * *